(12) United States Patent
Weiner

(10) Patent No.: US 7,777,281 B2
(45) Date of Patent: Aug. 17, 2010

(54) NON-VOLATILE TRANSISTOR MEMORY ARRAY INCORPORATING READ-ONLY ELEMENTS WITH SINGLE MASK SET

(75) Inventor: Albert S. Weiner, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/810,035

(22) Filed: Mar. 26, 2004

(65) Prior Publication Data

US 2005/0212150 A1      Sep. 29, 2005

(51) Int. Cl.
*H01L 27/088* (2006.01)
(52) U.S. Cl. .................... 257/390; 257/314; 257/315; 257/E27.102; 438/128; 365/185.01
(58) Field of Classification Search .................. 257/298, 257/315, 91, 98, 314, 390, E27.102, E21.209; 365/185.05, 206, 207, 185.01; 438/128–230, 438/275, 278, 290
See application file for complete search history.

(56) References Cited

U.S. PATENT DOCUMENTS

| | | | | |
|---|---|---|---|---|
| 5,132,928 | A * | 7/1992 | Hayashikoshi et al. | 365/185.13 |
| 5,316,963 | A | 5/1994 | Kojima | |
| 5,488,006 | A | 1/1996 | Shirota | |
| 5,504,707 | A * | 4/1996 | Koizumi | 365/185.04 |
| 5,535,157 | A * | 7/1996 | Campardo et al. | 365/185.05 |
| 5,680,343 | A | 10/1997 | Kamaya | |
| 6,031,771 | A * | 2/2000 | Yiu et al. | 365/200 |
| 6,174,759 | B1 * | 1/2001 | Verhaar et al. | 438/201 |

(Continued)

FOREIGN PATENT DOCUMENTS

EP      0991118 A1      4/2000

(Continued)

OTHER PUBLICATIONS

U.S. Appl. No. 11/354,443 Notice of Allowance mailed Mar. 18, 2008, 7 pgs.

(Continued)

*Primary Examiner*—Thinh T Nguyen
(74) *Attorney, Agent, or Firm*—Schwegman, Lundberg & Woessner P.A.

(57) ABSTRACT

A memory array has memory elements of identical topology or footprint arranged in rows and columns. Some of the memory elements are EEPROM cells and other memory elements are read only memory cells but all are made using a mask set having the same length and width dimensions. In the mask set for EEPROMs a principal mask is used for formation of a depletion implant. In the case of one type of read-only memory element, this mask is mainly blocked, leading to formation of a transistor with a non-conductive channel between source and drain. In the case of another read only memory element, the same mask is unblocked, leading to formation of a transistor with a highly conductive or almost shorted channel between source and drain. These two read only memory elements are designated as logic one and logic zero. By having rows of read-only memory elements with rows of EEPROMs on the same chip, a more versatile memory array chip may be built without sacrificing chip space.

10 Claims, 4 Drawing Sheets

U.S. PATENT DOCUMENTS

| | | | |
|---|---|---|---|
| 6,187,634 B1 * | 2/2001 | McElheny et al. | 438/263 |
| 6,326,661 B1 | 12/2001 | Dormans et al. | |
| 6,355,530 B1 * | 3/2002 | Ho et al. | 438/276 |
| 6,396,767 B1 | 5/2002 | Tzeng et al. | 365/230.06 |
| 6,678,190 B2 * | 1/2004 | Yang et al. | 365/185.05 |
| 6,687,154 B2 * | 2/2004 | Lee et al. | 365/185.03 |
| 6,822,286 B2 * | 11/2004 | Hsu et al. | 257/315 |
| 6,829,180 B2 | 12/2004 | Shau | |
| 2006/0131631 A1 | 6/2006 | Weiner | |

FOREIGN PATENT DOCUMENTS

| | | | |
|---|---|---|---|
| EP | 1024527 A2 | 8/2000 | |

OTHER PUBLICATIONS

U.S. Appl. No. 11/354,443, Amendment and Response filed Dec. 17, 2007 to Non-Final Office Action mailed Aug. 22, 2007, 20 pgs.

U.S. Appl. No. 11/354,443, Non-Final Office Action mailed Aug. 22, 2007, 11 pgs.

U.S. App. No. 11/354,443, Response filed Jun. 11, 2007 to Restriction Requirement mailed May 11, 2007, 3 pgs.

U.S. Appl. No. 11/354,443, Restriction Requirement mailed May 11, 2007, 8 pgs.

European Patent Application No. 05724590.4, Communication and Supplementary European Search Report mailed Feb. 29, 2008, 3 pgs.

PCT Application No. PCT/US05/07076, International Search Report mailed Sep. 1, 2005, 1 pg.

PCT Application No. PCT/US05/07076, Written Opinion mailed Sep. 1, 2005; 3 pgs.

Chinese Application Serial No. 200580016660.8, Office Action mailed May 16, 2008, (w/ English Translation), 12 pgs.

200580016660.8, "Chinese Application No. 200580016660.8, Office Action Mailed Jun. 5, 2009", 6 pgs.

200580016660.8, "Translation into English of Chinese Application No. 200580016660.8, Office Action Mailed Jun. 5, 2009", 6 pgs.

"Chinese Application Serial No. 200580016660.8, Response filed Aug. 18, 2008", (w/ English Translation), 15 pgs.

* cited by examiner

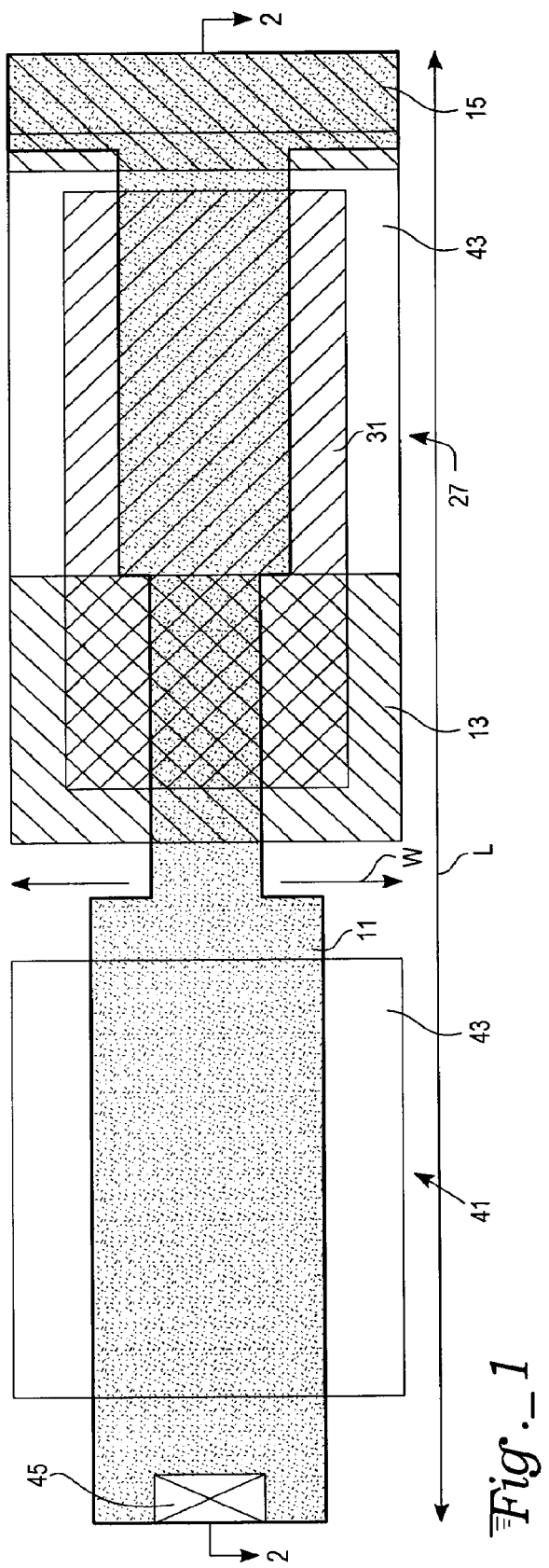
Fig._1
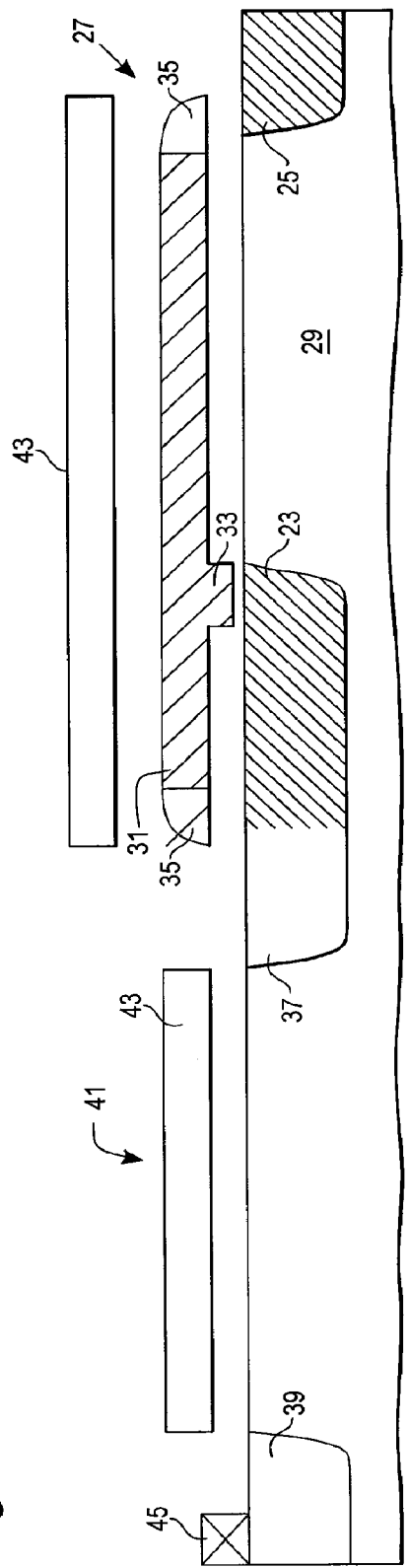
Fig._2

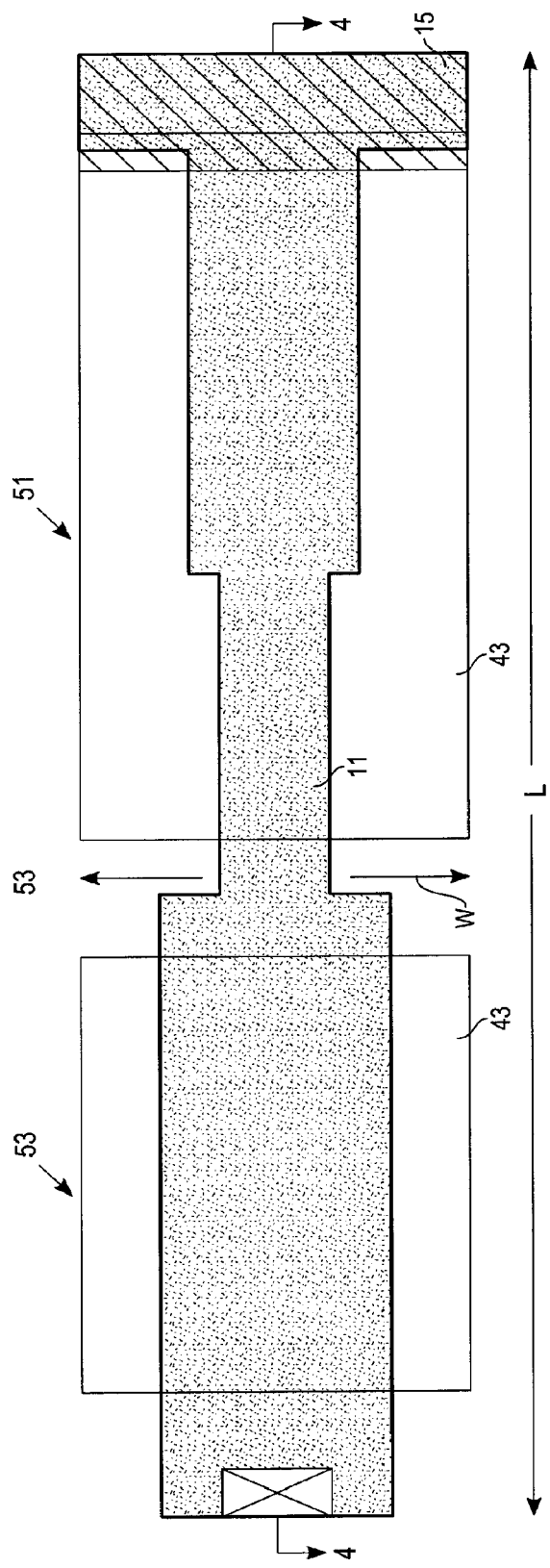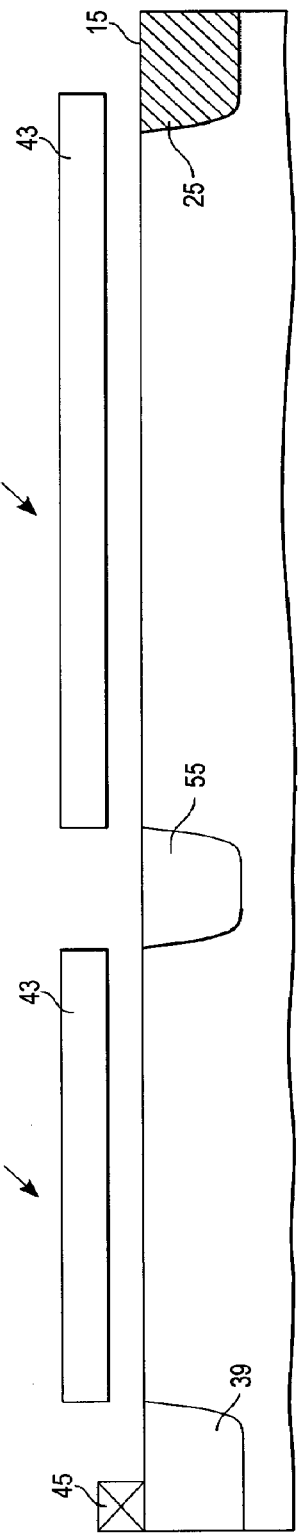

NON-VOLATILE TRANSISTOR MEMORY ARRAY INCORPORATING READ-ONLY ELEMENTS WITH SINGLE MASK SET

TECHNICAL FIELD

The invention relates to a semiconductor memory array having non-volatile and read only memory devices.

BACKGROUND ART

Many complex microcircuits, especially those employing internal microcontrollers, have a need for non-volatile memory in which to store critical data. Typically this data consists of operating instructions for a microcontroller, although it may also consist of other critical data such as keys or configuration data. The development of this data is frequently a lengthy task, with the data not fully debugged until after a microcircuit is developed. Once this data is fully developed, it is often desirable to make the data permanent. There are several reasons for this. A first reason is that the overall security of the system may be compromised if the data can be altered. Another reason relates to reduction of manufacturing cost. The time required to program each microcircuit can be eliminated from the manufacturing cycle if programming resides in pre-programmed read only memory devices. A third reason relates to reliability of the data. Many non-volatile memory arrays are susceptible to environmental effects, such as temperature or radiation, which could disturb the data. An object of the invention is to provide a semiconductor memory array having mostly non-volatile memory cells but with permanently written data in portions of the memory array.

SUMMARY OF THE INVENTION

Within a non-volatile transistor memory element, specifically an EEPROM cell, there is typically a depletion implant in a MOS or CMOS process used to provide conduction in areas not under the control of polysilicon gates. This depletion implant is established by a mask or masks in the manufacturing process used to define the areas within the cell that receive the implant. The present invention makes use of this mask modified to provide programming data to a ROM cell. The depletion implant is either substantially removed from the cell (for a MOS transistor structure with no channel between source and drain electrodes, thereby designating a 0) or extending all the way under the cell (for a shorted channel between the source and drain, thereby designating a 1). The presence or absence of the depletion implant is all that is required to determine the state of the bit.

In addition, for permanently written memory cells, masks that define the floating polysilicon gate and the feature that defines the thin tunnel oxide are not needed. By blocking formation of these two layers the cells lose the ability to be changed by standard EEPROM programming techniques.

This invention allows the same EEPROM mask set to be used as a ROM mask of the same footprint on a selected basis, for example, a row-by-row basis. The unaltered rows would continue to function as an EEPROM. This change can be made without any redesign of the existing microcircuit mask set or even the EEPROM mask set itself, or the manufacturing process.

In other words, essentially the same set of masks can be used to form all transistors, both non-volatile memory elements and read-only memory elements with blocking or non-use on the one hand or opening of some mask portions on the other hand, thereby leading to the same footprint for all transistors in a memory array. Use of the same footprint leads to greater geometric regularity in the array topology and the opportunity to achieve greater functionality in a memory array that has the same dimensions as one without the enhanced functionality.

BRIEF DESCRIPTION OF THE DRAWINGS

FIG. 1 is a top plan view of a non-volatile memory transistor device in accordance with the invention.
FIG. 2 is a side sectional view of the device of FIG. 1 taken along lines 2-2.
FIG. 3 is a top plan view of a first read-only memory transistor device in accordance with the invention.
FIG. 4 is a side sectional view of the device of FIG. 3 taken along lines 4-4.

BEST MODE FOR CARRYING OUT THE INVENTION

With reference to FIGS. 1 and 2, an EEPROM cell is shown having length L and width W dimensions, with an areawise footprint L×W. Such a cell would normally be a single element in an memory array having "n" rows and "m" columns where "n" and "m" are integers.

Figure 7:
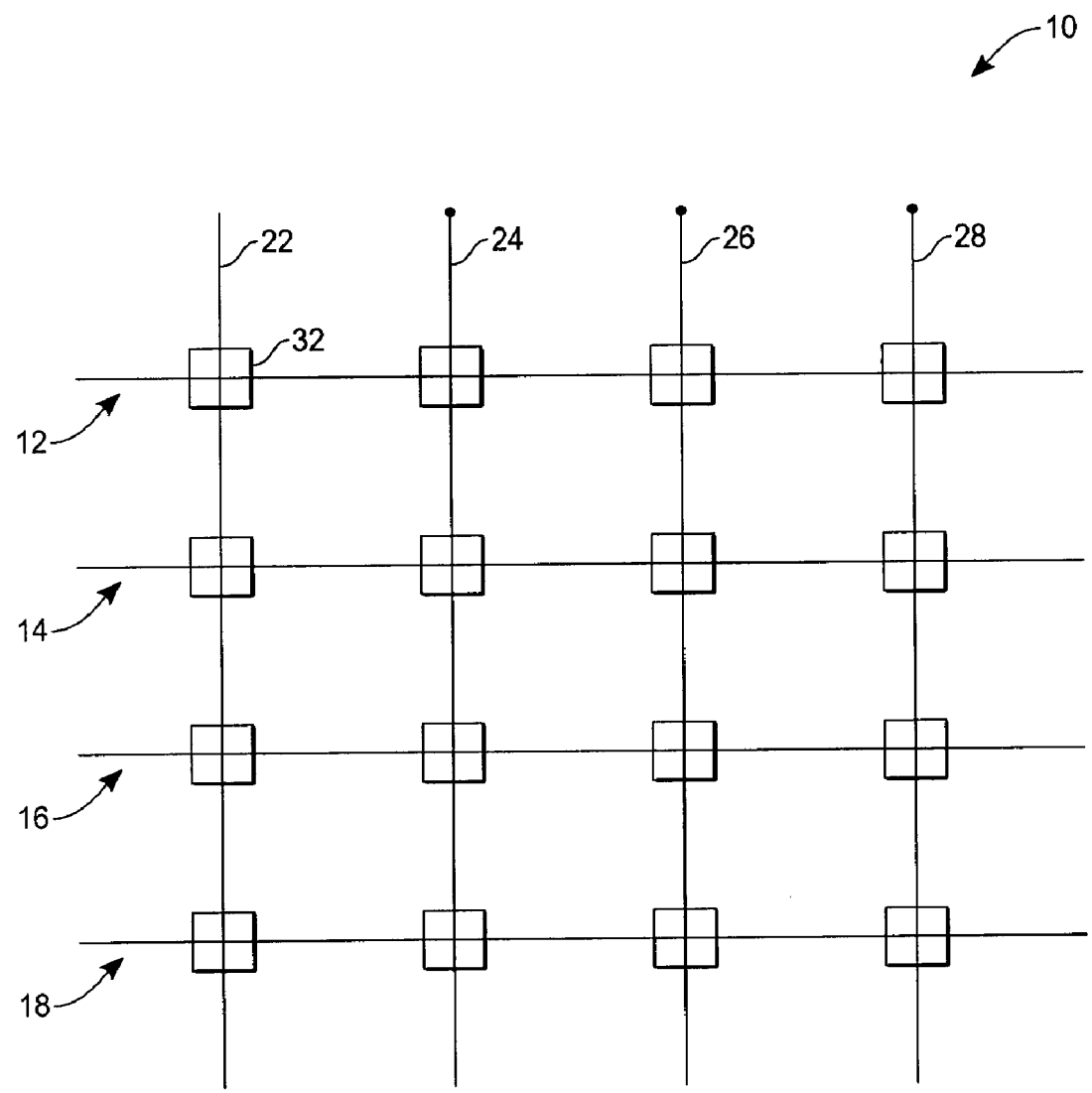
FIG. 7 is a schematic diagram of memory cells in a memory array.

A p-type wafer has memory cells as shown in FIG. 7. Returning to FIGS. 1 and 2, the memory cells are laid out by first establishing an active area 11, indicated by stippling in FIG. 1 and defined by a mask. The active area is seen to have longitudinal or lengthwise axis, parallel to line L, but running through the entire length of the active area. The active area is lightly doped and will contain source and drain implants for two MOS transistors.

Next, a buried n-diffusion is established in regions 13 and 15, indicated by forward-slant hatching. This is a heavily doped n+region in the substrate 29 suitable for forming electrodes. Region 13 forms part of drain 23 in FIG. 2 and n-diffusion region 15 forms part of source 25 in an EEPROM transistor 27. Between the subsurface drain 23 and source 25 is a channel established by electric fields that are set up between source, drain and gate.

Above the substrate 29 is a first conductive polysilicon layer 31, known as "poly I", seen by reverse line hatching in FIGS. 1 and 2. Below the poly I layer, a layer of thin oxide exists sometimes called "tunnel oxide" with a window defining a polysilicon "dip-down" feature 33 used to facilitate tunneling. The tunnel oxide layer is thinnest below the dip-down feature 33, and above the substrate, frequently requiring a number of masks to define feature 33 within the thin oxide layer. Atop the thin tunnel oxide layer and merged with the tunnel oxide is gate oxide insulatively separating the poly I layer 31 from the substrate 29. The poly layer 31 may have optional nitride spacers 35 protecting the poly I layer from peripheral charge leakage or contamination.

A source region 39 in FIG. 2 can be an ion implanted zone, together with the left side 37 of shared drain 23, also an ion implanted region for forming a sense transistor 41. A second polysilicon layer 43, poly II, spaced over the substrate 29 by gate oxide above substrate 29, can serve as an alignment tool for implanting ions into substrate 29 to form source 39 and drain 37. In the EEPROM transistor 27 the poly II layer 43 resides atop the poly I layer 31.

Note that the width dimension, W, of the select transistor 41 appears to be the same as the width dimension of the EEPROM transistor 27 such that the overall dimensions of the cell appear to be generally rectangular having dimensions L×W. This need not be the case and generally would not be the case. Slight differences in width exist. A contact 45 allows external communication with drain 39. Communication with other electrodes may be made be stripe-like conductive paths (not shown) through these electrodes, or by other techniques well known in the art.

In FIGS. 3 and 4, a read-only memory device 51 and select transistor 53 is shown having the same L×W dimensions as the EEPROM and select transistor of FIGS. 1 and 2. The active area 11 is defined by the same masks as in FIGS. 1 and 2. Similarly, the poly II layers 43 are in the same relation in the top view of FIG. 3, although the right hand poly II layer is lower in FIG. 4 because there is no poly I layer beneath it as in the EEPROM of FIG. 1. There is a buried n-diffusion 15 on the right side of the device giving rise to source 25 but there is no conductive path to drain 55. The select transistor 53 will always sense an open circuit because the channel between source 25 and drain 55 is permanently open. The memory device of FIG. 3 is thus a read only memory having a particular memory state, for example a logic zero. In manufacturing the device in FIGS. 3 and 4, it should be noted that the buried n-diffusion region 15 is very limited. This means that the mask for forming the n-diffusion is blocked to protect most of the substrate from the n-diffusion, a change relative to FIGS. 1 and 2. Moreover, masks for forming the tunnel oxide region and the poly I region are not employed. The mask for forming the poly II region remains the same.

Figure 5:
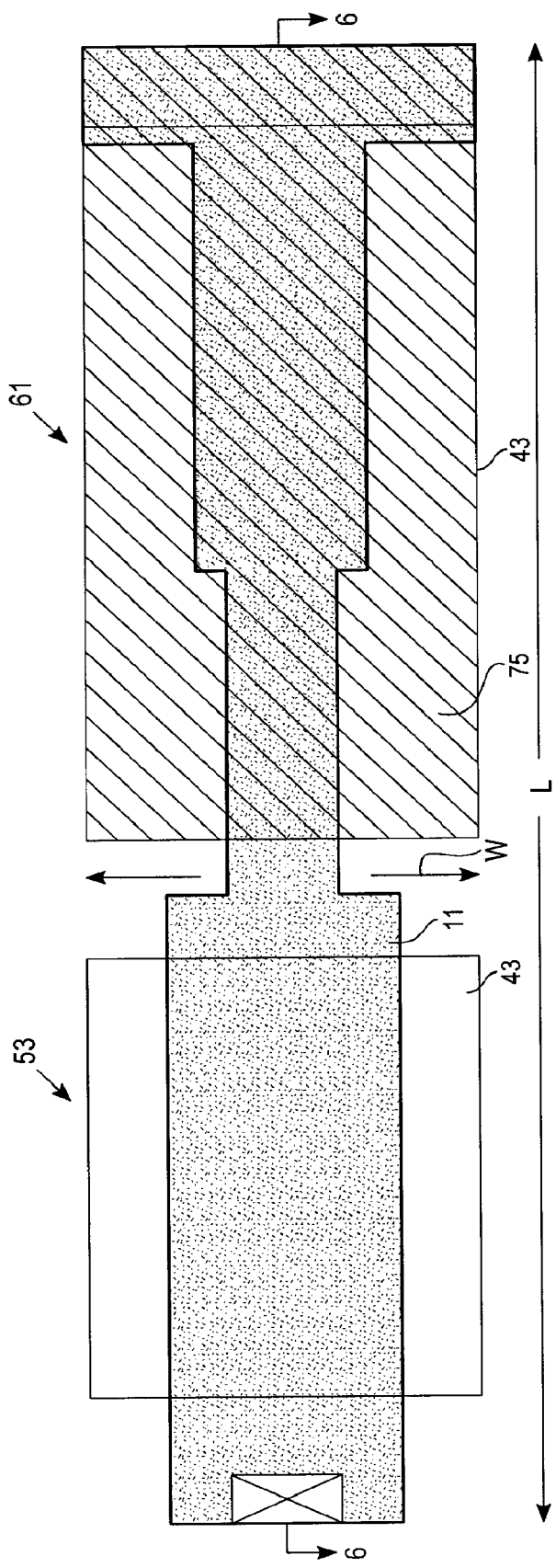
FIG. 5 is a top plan view of a second read-only memory transistor device in accordance with the invention.
Figure 6:
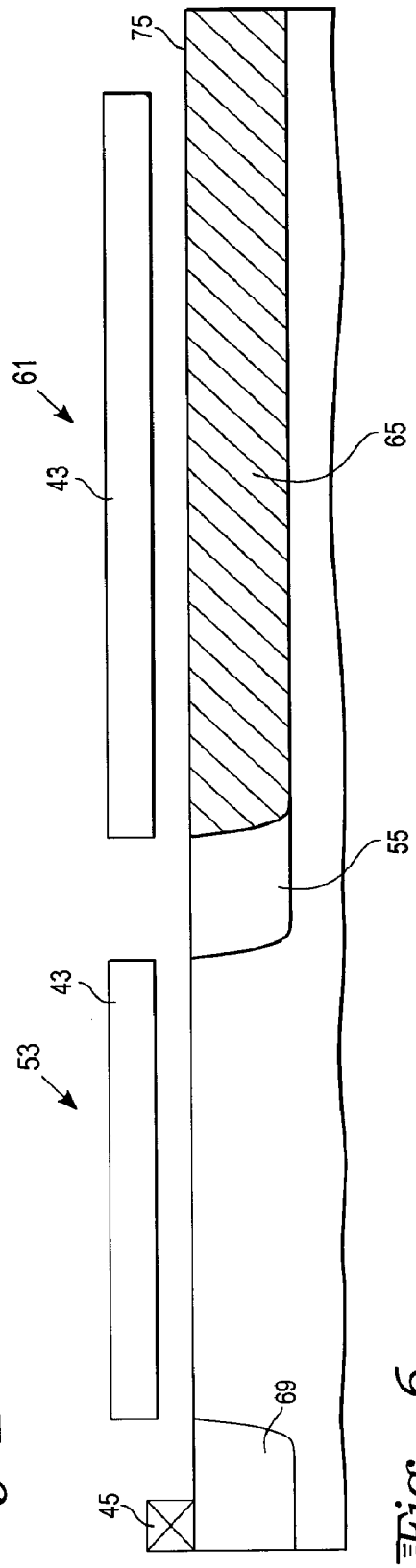
FIG. 6 is a side sectional view of the device of FIG. 5 taken along lines 6-6.

In FIGS. 5 and 6, a read-only memory device 61 and select transistor 53 are shown having the same combined L×W dimensions as the EEPROM and select transistors of FIGS. 1 and 2 and the same combined dimensions as the read-only memory device and select transistor of FIGS. 3 and 4. The active area 11 is defined by the same mask as in FIGS. 1-4. Similarly, the poly II layers 43 are the same as in FIG. 4. The principal difference between FIG. 5 and FIG. 3 is that the buried n-diffusion 65 extends longitudinally across the memory cell 61 completely under the poly II layer 43, essentially forming a subsurface conductive layer under the poly II layer and merging the source electrode 65 with the less heavily doped drain electrode 55. The select transistor 53 in FIG. 6 has a source 69, a gate 43 made of poly II layer material and a shared drain 55. Select transistor 53 senses a permanently shorted read-only memory transistor 61 with the channel region always shorting drain 55 to source 65.

In the manufacture of the device of FIGS. 5 and 6, the mask for making the buried-n layer is unblocked, making the buried n-diffusion region of source 65 large, extending completely under the gate 43, a poly II layer portion. The select transistor 53 will always sense a closed circuit, i.e. low resistance, because the channel dimension between source and drain is reduced. The read-only memory device of FIG. 5 is assigned the opposite memory state as the device of FIG. 3, i.e. a logic one. The masks for making the device of FIG. 5 are the same as the masks for making the device of FIG. 3, except that the buried n-diffusion mask is modified as described.

In operation, it is necessary to separate rows of ROM memory from SEPROM memory in a group. For example, in FIG. 7, some of the rows 12, 14, 16, 18 could form a first group. Columns 22, 24, 26, 28 intersect the rows to form the array. Memory cells such as memory cell 32 reside at the intersections. For such rows, the poly IT control gate 43 is tied low to keep the "zero" cells turned off. While most transistors in an array will be ROM memory transistors, several rows of EEPROM memory elements, i.e. a second group of rows, not in the first group can be provided. Within each row of ROM cells, the programming of ones and zeros may be intermixed. Since the footprint for all devices is the same, different memory chips can have a different configuration of read-only memory elements, yet the chip topology will be the same.

What is claimed is:

1. A transistor memory array, comprising:
a first plurality of non-volatile user programmable memory cells, each including a first select transistor and a non-volatile memory transistor including at least one area having a gate oxide layer region disposed near a diffused region with a thickness less than a second gate oxide thickness disposed over a channel region and
a second plurality of mask programmed single conductive layer electrode read-only memory cells each including a mask programmed memory transistor and a second select transistor, the non-volatile memory cells and a read-only memory cells having the same footprint within a single memory array.

2. The memory array of claim 1 wherein said footprint has a longitudinal dimension and a width dimension that are the same for both the first and second pluralities of memory cells, with the respective first or second select transistor and memory transistor having a shared electrode in each memory cell.

3. The memory array of claim 1 wherein the read-only memory cells include cells having transistors with substrates having open channels and cells having transistors with substrates having shorted channels.

4. The memory array of claim 1 wherein the non-volatile memory cells have two poly layers and the read-only memory cells have one poly layer.

5. The memory array of claim 1 wherein the second plurality of read-only memory cells is grouped into rows.

6. The memory array of claim 5 wherein said group of rows of read only memory cells has a first subgroup of transistors in at least one row in a first logic state.

7. The memory array of claim 6 wherein said group of rows of read-only memory cells has a second subgroup of transistors in the at least one row in a second logic state.

8. The memory array of claim 3 wherein the channels in the transistors with substrates having open channels and in the transistors with substrates having shorted channels in the read-only memory cells are defined by a buried depletion implant in said substrate, the extent of the implant defining the open and shorted channels.

9. The transistor array of claim 1 wherein said non-volatile memory cells have EEPROM transistors.

10. The memory array of claim 1 comprising a second plurality of non-volatile user programmable memory cells.

* * * * *

UNITED STATES PATENT AND TRADEMARK OFFICE
CERTIFICATE OF CORRECTION

PATENT NO. : 7,777,281 B2  
APPLICATION NO. : 10/810035  
DATED : August 17, 2010  
INVENTOR(S) : Albert S. Weiner It is certified that error appears in the above-identified patent and that said Letters Patent is hereby corrected as shown below:

In column 4, line 2, delete "SEPROM" and insert -- EEPROM --, therefor.

In column 4, line 6, delete "IT" and insert -- II --, therefor.

In column 4, line 22, in Claim 1, delete "region" and insert -- region; --, therefor.

Signed and Sealed this

Sixteenth Day of November, 2010

David J. Kappos
*Director of the United States Patent and Trademark Office*